United States Patent
Chakraborty et al.

(10) Patent No.: US 11,706,075 B2
(45) Date of Patent: Jul. 18, 2023

(54) HIGH-EFFICIENCY TRANSMITTER

(71) Applicant: INTERNATIONAL BUSINESS MACHINES CORPORATION, Armonk, NY (US)

(72) Inventors: Sudipto Chakraborty, Plano, TX (US); Rajiv Joshi, Yorktown Heights, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 68 days.

(21) Appl. No.: 17/199,867

(22) Filed: Mar. 12, 2021

(65) Prior Publication Data
US 2022/0294683 A1  Sep. 15, 2022

(51) Int. Cl.
*H04B 1/04* (2006.01)
*H04L 27/36* (2006.01)
*G05F 1/46* (2006.01)
*H01Q 3/36* (2006.01)
*H04L 7/04* (2006.01)

(52) U.S. Cl.
CPC ............... *H04L 27/36* (2013.01); *G05F 1/46* (2013.01); *H01Q 3/36* (2013.01); *H04B 1/04* (2013.01); *H04L 7/04* (2013.01)

(58) Field of Classification Search
CPC ... G05F 1/46; H04L 7/04; H04L 27/34; H04L 27/20; H04B 1/04; H04B 1/406; H01Q 3/36
See application file for complete search history.

(56) References Cited

U.S. PATENT DOCUMENTS

| | | | |
|---|---|---|---|
| 7,499,682 B2 * | 3/2009 | Rozenblit | ............. H03F 1/0205 375/345 |
| 7,760,043 B2 | 7/2010 | Nakamura et al. | |
| 7,817,747 B2 | 10/2010 | Waheed et al. | |
| 9,240,919 B2 | 1/2016 | Visser et al. | |
| 2003/0215025 A1 | 11/2003 | Hietala | |
| 2004/0184559 A1 | 9/2004 | Ballantyne | |

(Continued)

FOREIGN PATENT DOCUMENTS

| | | |
|---|---|---|
| WO | 2007113726 A1 | 10/2007 |
| WO | 2018196372 A1 | 11/2018 |

OTHER PUBLICATIONS

Sowlati, Tirdad, et al., "A 60-GHz 144-element Phased-array Transceiver for Backhaul Application", IEEE Journal of Solid-State Circuits. Oct. 18, 2018, pp. 3640-3659.

(Continued)

*Primary Examiner* — Nhan T Le
(74) *Attorney, Agent, or Firm* — Tutunjian & Bitetto, P.C.

(57) ABSTRACT

Transmitters and methods of transmitting a polar-modulated signal include a driver to output a polar-modulated signal according to a phase-modulation signal and an amplitude-modulation signal. A voltage regulator is connected to the driver, with the amplitude-modulation signal controlling an input of the voltage regulator and with the amplitude-modulation signal further being combined with an output of the voltage regulator to control an amplitude of the output of the driver to compensate for bandwidth cutoff noise in the voltage regulator.

17 Claims, 7 Drawing Sheets

(56) References Cited

U.S. PATENT DOCUMENTS

| | | | |
|---|---|---|---|
| 2008/0220826 A1* | 9/2008 | Dagher | H04W 52/52 455/572 |
| 2010/0271089 A1 | 10/2010 | Plevridis et al. | |
| 2011/0129037 A1 | 6/2011 | Staszewski et al. | |
| 2012/0114075 A1 | 5/2012 | Shimada et al. | |
| 2014/0285164 A1 | 9/2014 | Oishi et al. | |
| 2019/0379571 A1* | 12/2019 | Qian | H04L 25/02 |

OTHER PUBLICATIONS

Chae, Chang-Seok, et al., "A Fully On-chip VGA-based Load-independent Linear Amplitude Modulator for GSM/EDGE Polar Transmitters", In2008 IEEE Power Electronics Specialists Conference. Jun. 15, 2008, pp. 2308-2313.

Wu, Ying, et al., "A Two-phase Switching Hybrid Supply Modulator for Polar Transmitters with 9% Efficiency Improvement", In2010 IEEE International Solid-State Circuits Conference—(ISSCC). Mar. 18, 2010, pp. 196-198.

Perrott, Michael H., et al., "A 27-mW CMOS Fractional-N Synthesizer Using Digital Compensation for 2.5-Mb/s GFSK Modulation", IEEE journal of solid-state circuits. Dec. 1997, pp. 2048-2060.

Yu, Shih-An, et al., "A 0.65-V 2.5-GHz Fractional-N Synthesizer With Two-Point 2-Mb/s GFSK Data Modulation", IEEE Journal of Solid-State Circuits. Aug. 28, 2009, pp. 2411-2425.

Yoo, Sang-Min, et al., "A Switched-Capacitor Power Amplifier for EER/Polar Transmitters", In2011 IEEE International Solid-State Circuits Conference. Feb. 20, 2011, pp. 428-430.

Liu, Hanli, et al. "An ADPLL-Centric Bluetooth Low-Energy Transceiver with 2.3mW Interference-Tolerant Hybrid-Loop Receiver and 2.9mW Single-Point Polar Transmitter in 65nm CMOS", In2018 IEEE International Solid-State Circuits Conference—(ISSCC). Feb. 11, 2018, pp. 444-446.

International Search Report issued in corresponding PCT Application Serial No. PCT/EP2022/055097, dated Jun. 23, 2022, pp. 1-4.

Written Opinion issued in corresponding PCT Application Serial No. PCT/EP2022/055097, dated Jun. 23, 2022, pp. 1-7.

* cited by examiner

HIGH-EFFICIENCY TRANSMITTER

BACKGROUND

The present invention generally relates to transmitters, and, more particularly, to high-efficiency transmitters that may be used in sensor arrays.

Low-power sensor arrays are increasingly used for a variety of applications, including internet of things (IoT) devices, implantable devices, wearable devices, energy harvesting systems, seismic sensors, structural health monitoring systems, and multi-channel/multi-mode devices. While cartesian transmitters have been used, these transmitters consume significant power.

SUMMARY

A transmitter includes a driver to output a polar-modulated signal according to a phase-modulation signal and an amplitude-modulation signal. A voltage regulator is connected to the driver, with the amplitude-modulation signal controlling an input of the voltage regulator and with the amplitude-modulation signal further being combined with an output of the voltage regulator to control an amplitude of the output of the driver to compensate for bandwidth cutoff noise in the voltage regulator.

A phased-array transmitter includes radio front-ends that each transmit a respective phase-shifted version of a polar-modulated signal. Each radio front end includes a driver and a voltage regulator. The driver outputs a polar-modulated signal according to a phase-modulation signal and an amplitude-modulation signal. The voltage regulator is connected to the driver, with the amplitude-modulation signal controlling an input of the voltage regulator and with the amplitude-modulation signal further being combined with an output of the voltage regulator to control an amplitude of the output of the driver to compensate for bandwidth cutoff noise in the voltage regulator. A phased antenna array transmits the phase-shifted polar-modulated signals.

A method of transmitting a polar-modulated signal includes applying a constant-amplitude phase modulation signal to a driver. An amplification-control voltage is applied to the driver using a voltage regulator, with a first copy of an amplitude modulation signal being applied to an input of the voltage regulator and with a second copy of the amplitude modulation signal being combined with an output of the voltage regulator, to compensate for bandwidth cutoff noise in the voltage regulator. A polar-modulated output of the driver is transmitted using an antenna.

These and other features and advantages will become apparent from the following detailed description of illustrative embodiments thereof, which is to be read in connection with the accompanying drawings.

BRIEF DESCRIPTION OF THE DRAWINGS

The following description will provide details of preferred embodiments with reference to the following figures wherein.

DETAILED DESCRIPTION

To improve the efficiency of transmitters, such as in low-power applications, polar modulation may be used instead of cartesian modulation. In such modulation schemes, orthogonal components of a transmitted signal may be used to represent a "symbol" that encodes a certain amount of information. Different types of modulation have different properties, for example different bandwidth needs and different hardware.

The simplest such modulation scheme is on-off keying, where a binary value is encoded according to the amplitude of a transmitted signal. For example, a "high" amplitude may represent a first binary value, and a "low" amplitude may represent a second binary value. More complex modulation schemes include quadrature amplitude modulation, where two signals are transmitted at the same time, ninety degrees out of phase with one another. These two signals may establish a two-dimensional space, where each point in the space may represent a different set of bits. By varying the amplitude levels of these two signals, many bits may be encoded with a single symbol.

Quadrature amplitude modulation is a form of cartesian modulation, where one signal may represent an 'x' value the other signal may represent a 'y' value in a two-dimensional symbol space, defining the position of a symbol along the respective x-axis and y-axis of the constellation. Each point in the two-dimensional symbol space represents a different symbol, associated with a different respective bit sequence. Depending on the hardware and the channel characteristics, different numbers of amplitude levels are possible, with more amplitude levels corresponding to a constellation with a higher density, and more bits being conveyed with each symbol.

While such cartesian modulation schemes are common, they generally make use of high-fidelity linear amplifiers. The amplitude of a cartesian-modulated signal may vary significantly from one symbol to the next, with sudden changes. To accurately represent these changes, a high-quality amplifier is needed for transmission, otherwise errors may be introduced. A linear amplifier uses a relatively large amounts of power, making them impractical for distributed and small-scale transmitter designs.

In contrast, a polar modulation scheme uses a "radius" value and an "angle" value to represent a symbol in the two-dimensional symbol space. For example, a phase or frequency value of a signal may encode the angle value, while the amplitude of the signal may encode the radius value. A phase-modulated input to the amplifier may then have a constant amplitude, such that the amplifier does not need to accommodate large amplitude swings. Amplitude modulation for a polar modulated signal may then be performed by varying the power output of the amplifier. The resulting output signal will vary in phase, according to the phase of the input phase signal, and will further vary in amplitude, in accordance with a control signal to the amplifier.

Figure 1:
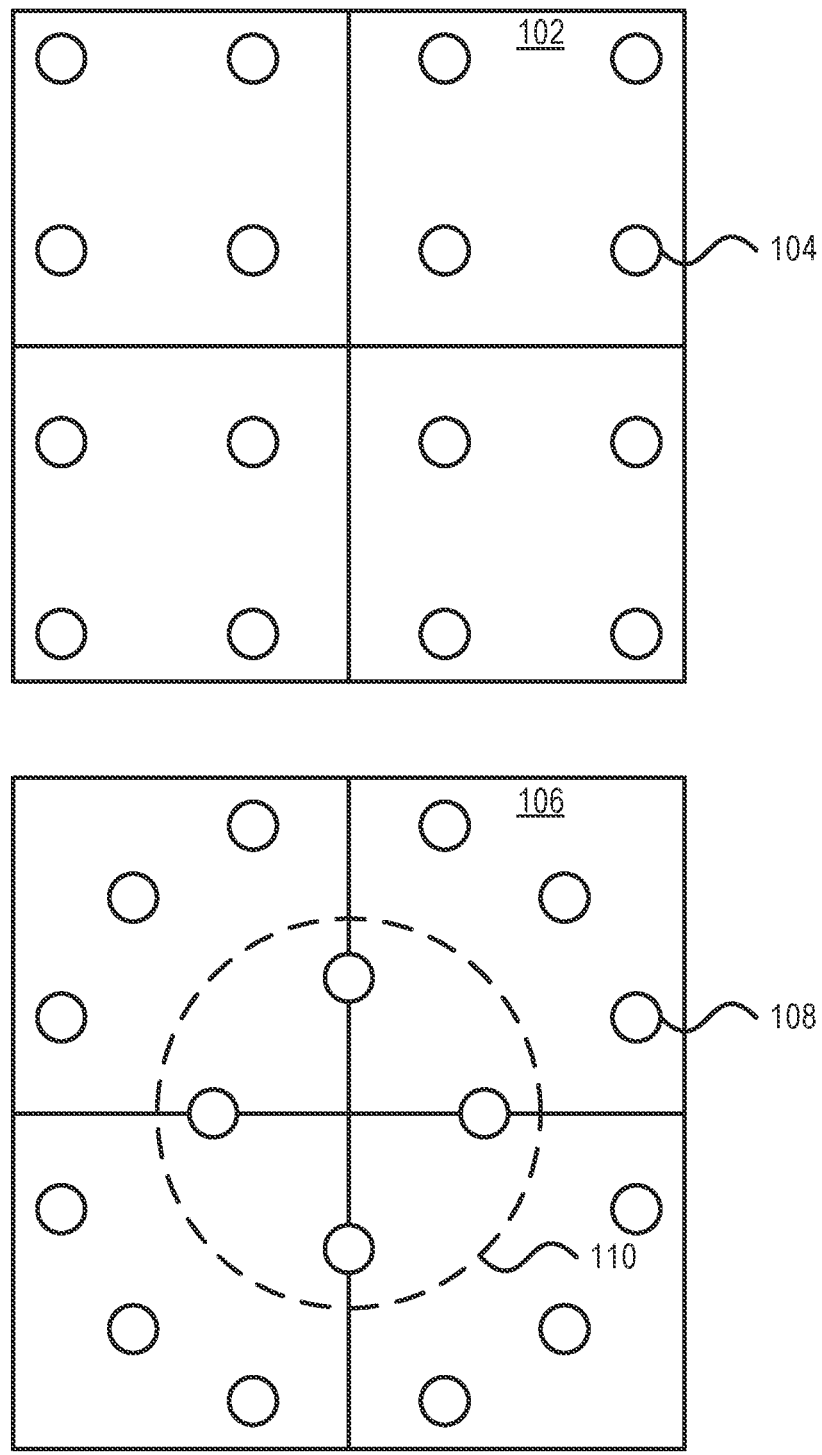
FIG. 1 is a diagram of a comparison of a Cartesian modulation constellation and a polar modulation constellation, suitable for use in modulating radio transmissions, in accordance with an embodiment of the present invention.

Referring now to FIG. 1, a comparison is shown between a cartesian symbol space 102 and a polar symbol space 106. The cartesian symbol space 102 includes a set of cartesian symbols 104, with the location of each symbol corresponding to a respective pair of values. The pair of values may be referred to as in-phase and quadrature, and may correspond to values on the x-axis and the y-axis. Such values may be transmitted as orthogonal phases, combined within a single signal. Each of these paths may therefore have respectively varying amplitudes, and their combined signal will similarly vary in amplitude. When these signals are input to the amplifier, the amplitude of the combined signal may be significantly different from one symbol to the next. The amplifier for a Cartesian-modulated signal has to precisely track the changing input power to prevent the introduction of distortion.

In the polar symbol space 106, the polar symbols 108 correspond to respective pairs of values, which may be referred to as an angle and a radius. The angle value may be encoded as the phase or frequency of the signal, while the radius value may be encoded as the amplitude of the signal. Rather than varying the amplitude at the input to the amplifier, the phase-modulated signal may be input at a constant amplitude 110. The amplifier may then vary the output to produce the final signal. Because the amplifier need not track changes in amplitude, power-efficient non-linear amplifiers may be used.

The amplitude may therefore be varied through control of the strength of the amplifier, for example by control of its supply voltage. Various mechanisms may be used to control this supply voltage, such as by using a voltage regulator.

A challenge in implementing low-power polar modulation, for example using a low dropout (LDO) regulator to control the supply voltage to the amplifier for amplitude modulation, is that an LDO circuit may have a bandwidth that is lower than a bandwidth that is to be used for transmission. When an input signal is used that has a higher bandwidth than the LDO permits (e.g., has a high-frequency range that exceeds what the LDO can handle), the LDO may introduce distortions in the signal, for example by cutting off some portions of the signal's frequency spectrum.

To address this problem, the cutoff output of the LDO is combined with a replica of the original input signal, before the combined signal is used to control the amplitude output of a driver circuit. The replica helps to recover the lost portion of the bandwidth, while keeping the distortion manageable.

Thus, a Cartesian modulated signal may be represented as:

$$Y_C(t) = P_I(t) \cos(\omega_{RF} t) + P_Q(t) \sin(\omega_{RF} t)$$

where $P_I(t)$ is the amplitude of an in-phase signal, $P_Q(t)$ is the amplitude of a quadrature signal, $\omega_{RF}$ is the frequency of the transmission, and t is the time. A polar modulation signal, meanwhile, may be represented as:

$$Y_P(t) = A(t) \cos(\omega_{RF} t + \theta(t))$$

where $A(t)$ is the amplitude modulation signal and $\theta(t)$ is the phase modulation signal. Cartesian modulation may be converted to polar modulation by defining $$A(t) = \sqrt{P_I^2 + P_Q^2} \text{ and } \theta(t) = \tan^{-1}\left(\frac{P_Q}{P_I}\right).$$

In a Cartesian representation, the modulated waveform may be represented using orthogonal vectors. A signal may be represented using in-phase (I) and quadrature (Q) terms, which may then be multiplied by the orthogonal phases of the carrier frequency, $\omega_{RF}$. In polar representation, the same signal may be represented by an amplitude and phase, both of which vary over time. This represents the same information as the Cartesian one, but may occupy higher bandwidth. As the data rates increase, both the amplitude and phase paths may occupy larger bandwidths.

Figure 2:
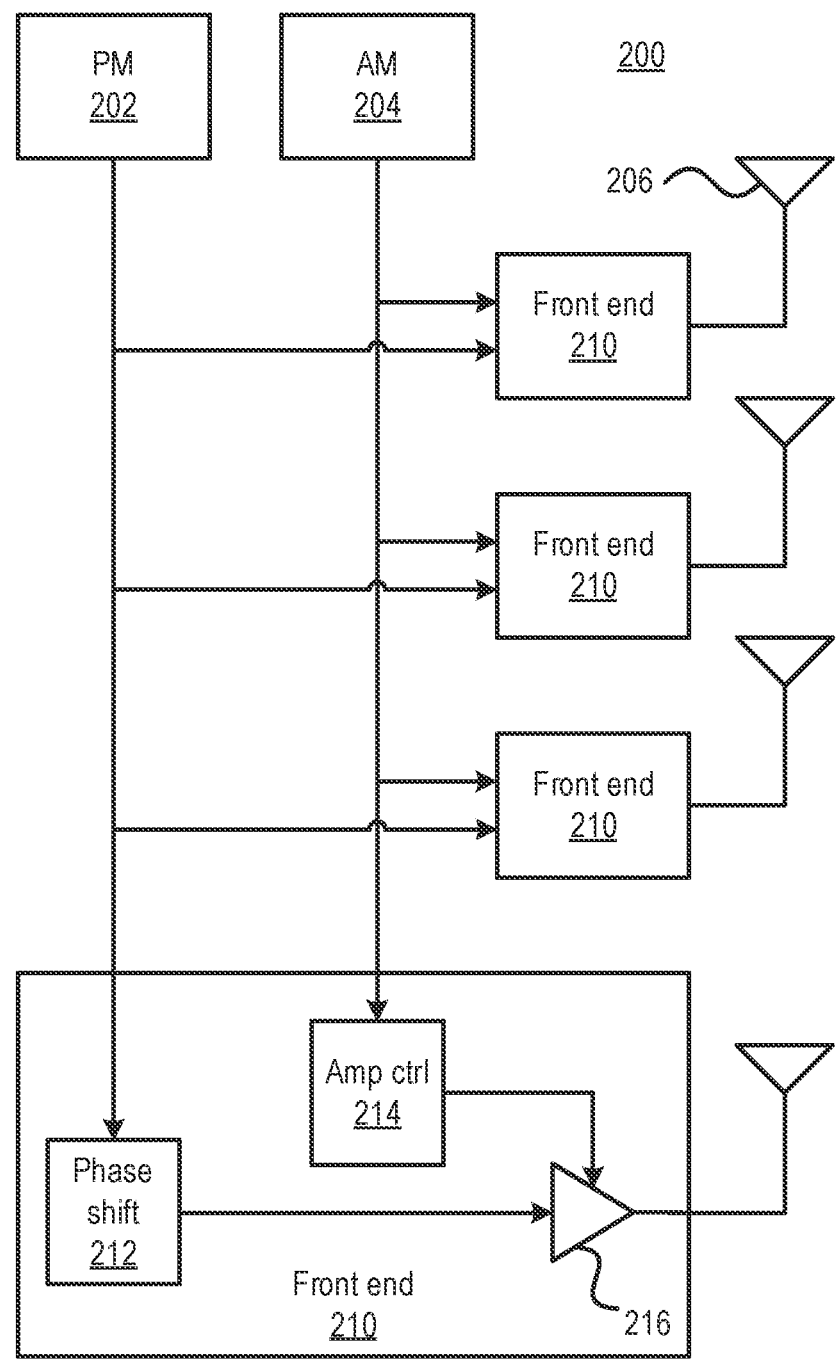
FIG. 2 is a block diagram of a transmitter that uses polar modulation, with the amplitude part being modulated onto a signal by controlling an output of an amplifier, in accordance with an embodiment of the present invention.

Referring now to FIG. 2, a transmitter 200 is shown, including a set of front ends 210. Although multiple radio front ends 210 are shown, for example to be used in beam steering applications, it should be understood that the present principles may be applied to transmitters having only a single radio front-end 210 as well. Each radio front end 210 outputs a respective phase-shifted version of a transmitted signal to a respective antenna 206. These phase-shifted versions of the signal multiple antennas interfere with each other, producing regions of space with relatively high and relatively low power, making it possible to focus a transmission to a specific receiver.

The signal includes a phase-modulation part 202 and an amplitude-modulation part 204. Although phase modulation is specifically contemplated, it should be understood that any appropriate type of modulation may be used, such as frequency modulation. These two parts of the signal may include distinct sets of information, such as distinct bit streams, which are both included in a single transmission output.

Both signals are input to each of the radio front ends 210. The phase modulation signal 202 may be generated using a phase-locked loop (PLL), which may be used to alter the phase of an input signal with respect to a reference signal. During operation, the PLL may furthermore maintain synchronization between the phase modulation signal 202 and the amplitude modulation signal 204, in case these two signals should begin to drift from one another.

Each radio front end 210 has an amplitude path and a phase path, which carry the respective amplitude-modulation signal 204 and phase-modulation signal 202. On the phase path, the phase-modulation signal 202 is shifted by phase shifter 212 in accordance with a beam-steering direction. This phase-shifted phase-modulation signal may be input, at a constant amplitude, to a driver 216. The amplification power output of the driver 216 is controlled by amplitude control circuitry 214.

The amplitude control circuitry 214 receives the amplitude-modulation signal 204 and uses it to control the power that is supplied to the driver 216, thereby applying amplitude modulation to the phase-shifted phase-modulation signal. As the driver 216 only needs to process the phase of the input signal, it may be implemented using inverters, e.g., as a combination of a p-channel metal oxide semiconductor transistor and an n-channel metal oxide semiconductor transistor. Switching classes of amplifiers may be used to implement the driver 216, with the supply voltage being modulated for higher efficiency, while maintaining a wide bandwidth. For example, class AB, D, E, and F amplifiers may be used to implement the driver 216. The present transmitter structures may provide power efficiencies that are hundreds of times better than systems using mixer-based transmitters.

Figure 3:
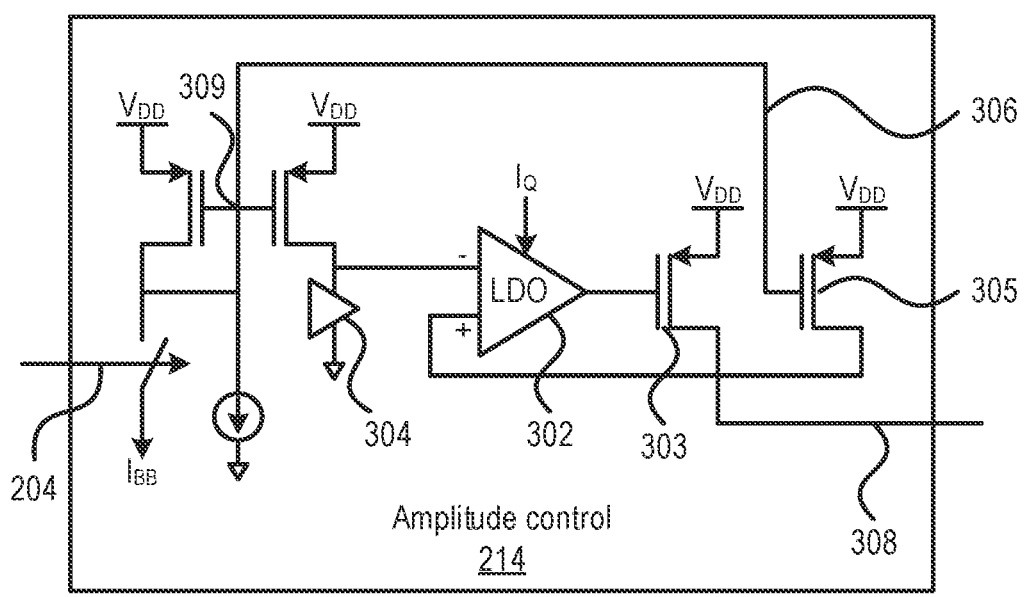
FIG. 3 is a circuit schematic of an amplitude control device that controls an amplitude of a driver in accordance with an amplitude modulation signal, using a low dropout voltage regulator output, in accordance with an embodiment of the present invention.

Referring now to FIG. 3, additional detail on the amplitude control circuitry 214 is shown. The amplitude-modulation signal 204 is provided as input. This input signal is used to trigger a replica circuit 304, which includes a copy of the driver 216, and which feeds into an LDO 302. The replica circuit 304 provides a scaled-down version of the main driver 216, such that voltage tracking can be accurately performed between the replica 304 and the driver 216. For example, if the main driver 216 uses 1 mA, the replica circuit 304 may be ten times smaller, drawing 100 µA. This provides a low loss of efficiency in the implementation of tracking. Thus, the replica circuit 304 may have the same basic structure of the driver 216, but with a design that scales current consumption appropriately.

The LDO 302 outputs a control signal to a transistor 303 that provides a base output signal. The input amplitude-modulation signal 204 further generates a bypass signal 306 that operates a transistor 305 to combine with the base output signal. This provides a driver control output 308. The combined driver control output 308 is also fed back to the LDO 302. By reintroducing the input signal 204 after the LDO 302, the out-of-band information that was lost due to the bandwidth constraints of the LDO 302 is recovered. In addition, because the inputs and outputs of the LDO 302 are perturbed by the same signal, the difference cancels out, such that there is no impact on the power supply rejection ratio for the LDO 302.

Any modulated signal in polar form may provide amplitude variations around an average value, due to the periodic nature of the waveform. For any waveform, an average value may be defined, as well as a peak value. The ratio of the peak value to the average value is known as the peak to crest factor of the waveform. The current mirror 309 provides a reference current that is the sum of the average current $I_{AVG}$ and the dynamic current that varies around that average value. This may further be multiplied by a mirroring ration, and is provided to the reference voltage generator of the LDO 302. The $I_{BB}$ signal represents the dynamic current, with the corresponding switch providing additional current that is proportional to the digital control word that represents the amplitude modulation part of the signal.

The LDO 302 may be designed to have a low quiescent current $I_Q$, representing the current that the LDO 302 draws when not active, and a low bandwidth. Additionally, this architecture provides a fast startup, with a low time constant. Furthermore, as the data rate increases, the amplitude and phase paths may need large bandwidths.

The voltage regulation loop of the LDO 302 may be designed to provide rejection of certain types of frequency-dependent noise from an unregulated voltage input. However, to provide this noise rejection, the LDO 302 may use a negative feedback loop, which operates over a certain bandwidth. To avoid this bandwidth limitation, the digital code that is used for amplitude modulation is provided to the current steering element, which provides a dynamic current that is proportional to the digital code and which operates at a high speed. The same current is provided and both the input and the output of the LDO 302, with one going to the replica circuit 304 and the other going to the driver 216.

In some cases, amplitude modulation may be performed using a combination of coarse and fine step sizes. For example, adjusting the coarse input may control which quadrant of a constellation a modulation symbol is in, while the fine input may control which point within the quadrant is used. The input 204 may therefore include multiple different input paths, for example with a fine input path controlling a switch that adds a certain current to the input 204. A similar switch may be added to the output 308, which may selectively divert some of the amplitude of the output current toward ground. In this manner, a fine amplitude change may be provided, on top of the coarse amplitude that is sent to the amplitude control 214.

Figure 7:
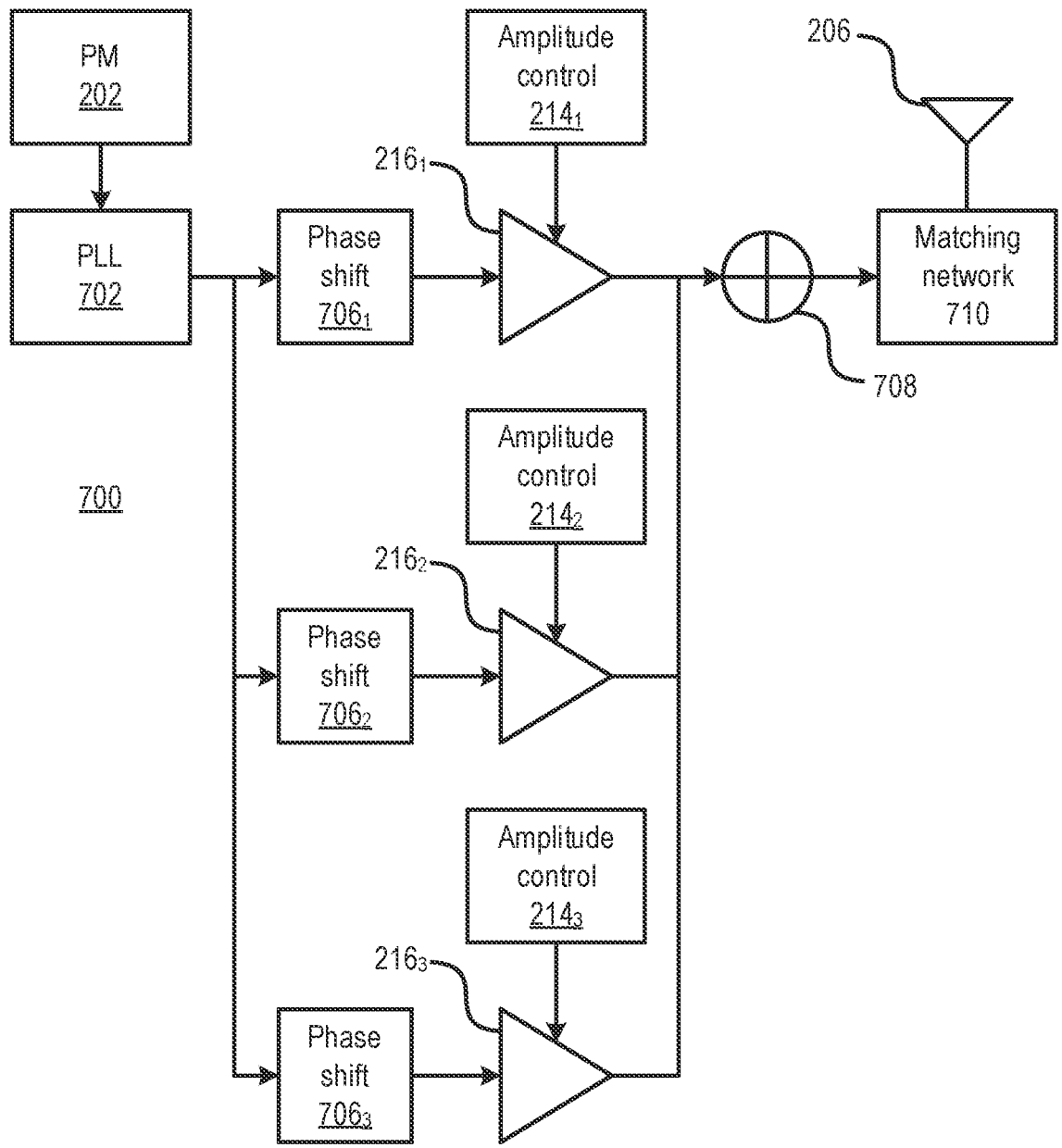
FIG. 7 is a block diagram of a transmitter that uses polar modulation and that has multiple phase paths and multiple amplitude paths, in accordance with an embodiment of the present invention.

Referring now to FIG. 7, a transmitter 700 is shown. The amplitude path may be segmented into multiple parallel paths, providing high efficiency and lower power consumption. Thus, multiple amplitude control blocks 214 are shown, each of which may separately receive the amplitude-modulation part 204. Each segment may operate on an orthogonal phase of the phase path, and the signal can be reconstructed as an addition of the multiple parallel paths. Orthogonal phases from the phase locked loop (PLL) 702 can also be used to create a constellation map for the specific modulation under consideration. The PLL 702 may provide orthogonal phases using a frequency divider. A circuit to provide a multiphase oscillator can also be used to provide phase modulated waveforms.

For example, phase modulation may be implemented using PLL 702, with the phase shifters $706_n$, providing respective phase shifts $\varphi_1$, $\varphi_2$, $\varphi_3$, may be used to provide specific phase shifts to the phase modulated signals generated in the PLL 702. These phase paths may also use separate LDOs in the respective amplitude control blocks $214_n$ to achieve higher efficiency and faster operation. The phase shifters $706_n$ may include tunable passive elements, delay elements, or frequency dividers. The outputs of the amplifiers $216_n$ are combined at signal adder 708 before leading to the matching network 710 and then to the antenna 206.

Figure 4:
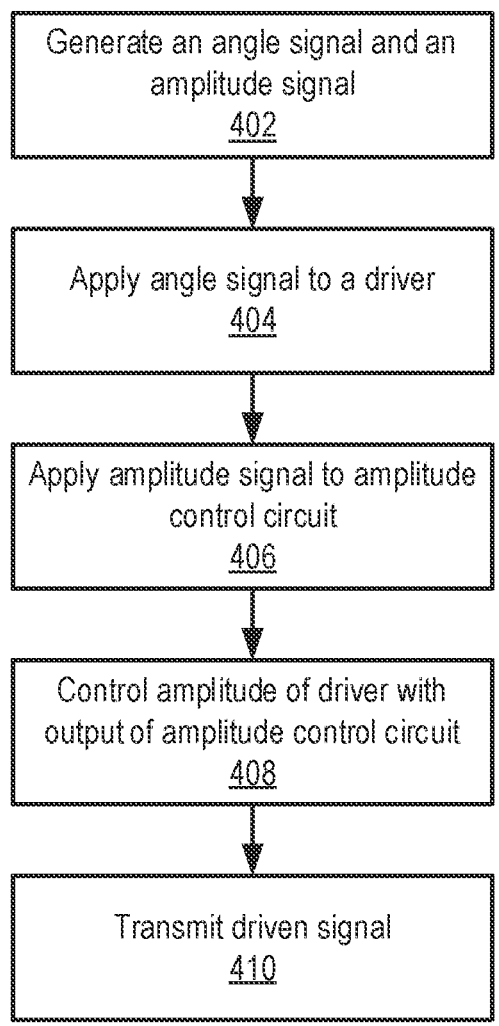
FIG. 4 is a block/flow diagram of a method for transmitting a polar-modulated signal including controlling an output of an amplifier, in accordance with an embodiment of the present invention.

Referring now to FIG. 4, a method of transmitting a polar-modulated signal is shown. Block 402 generates an angle signal and an amplitude signal. As will be described in greater detail below, these signals encode a position in a two-dimensional symbol space that corresponds to a symbol, where the symbol represents a series of bits. As noted above, the angle signal may be encoded using any appropriate form of keying, such as phase-shift keying or frequency-shift keying. These two signals are provided to each radio front end 210.

An angle signal, such as the phase-modulation signal 202, is applied in block 404 to a driver 216 of the radio front end 210. While it is specifically contemplated that the angle signal may have a constant amplitude, it should be understood that the angle signal may vary in amplitude within a predetermined range. Block 404 may include applying a phase shift to the angle signal, before it is sent to the driver 216.

The amplitude signal is applied, in block 406, to an amplitude control circuit 214. As noted above, the amplitude signal may be applied to the amplitude control circuit 214 at two points, including an injection point at an input to an LDO 302 and an injection point that combines with the output of the LDO 302. Block 408 uses the output of the amplitude control circuit 214 to control the power amplification of the driver 216.

The output of the driver 216 is a signal having a polar modulation. This signal passes to the antenna 206, for example by a transmission line or matching network, and is transmitted at block 410. In the event that an array of radio front ends 210 is used, each respective front end 210 may perform blocks 404-410, with a different phase shift being applied to provide a beam steering effect.

Figure 5:
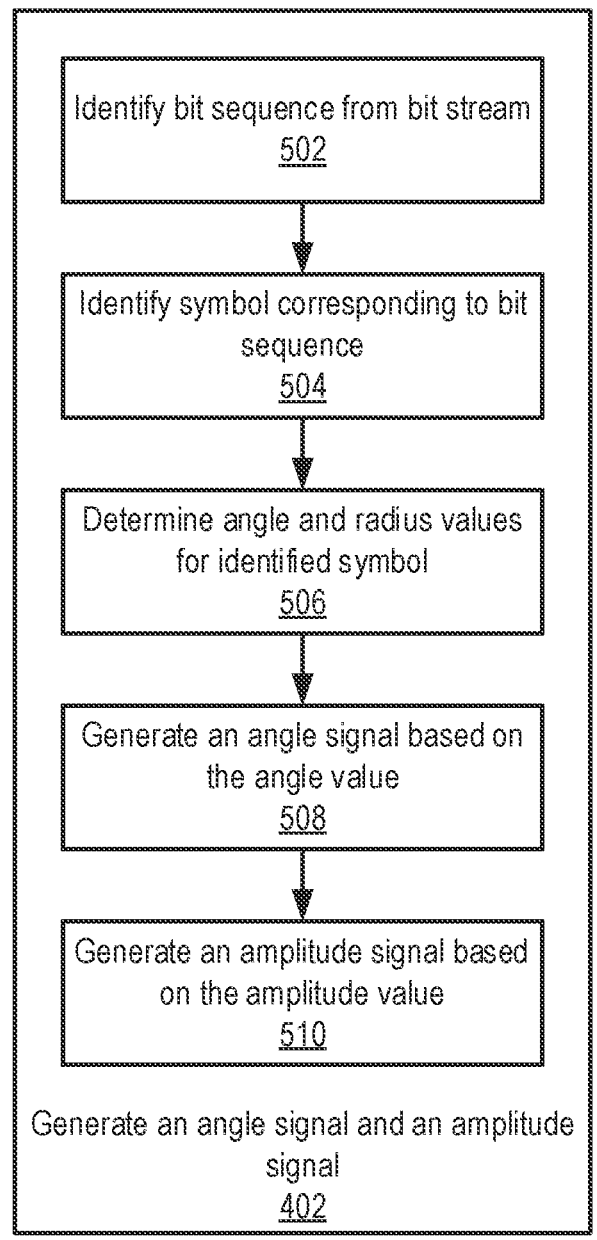
FIG. 5 is a block/flow diagram of a method for generating an angle signal and an amplitude signal that may be used for polar-modulated transmission, in accordance with an embodiment of the present invention.

Referring now to FIG. 5, additional detail is provided on the generation of the angle signal and the amplitude signal. Block 502 receives a bit stream that includes data to be transmitted, and identifies a bit sequence from the bit stream. The length of the bit sequence will depend on the type of polar modulation scheme that is being used. For example, in a modulation scheme with sixteen symbols, a four-bit sequence may be identified. Block 504 identifies a symbol that corresponds to the identified bit sequence. This may be performed with a lookup table, with each bit sequence being recorded with a corresponding symbol. Block 506 then determines the angle and radius values that correspond to the symbol, for example by looking up these values in the lookup table. The angle and radius values may also be calculated according to a mathematical function that describes the modulation constellation.

Block 508 generates an angle signal, based on the angle value. For example, the angle signal may include a phase shift or frequency shift, with the degree of shift from some base value corresponding to the angle value. Block 510 generates an amplitude signal, based on the amplitude value. The amplitude signal may include a signal that has a constant phase and frequency, but that varies according to its amplitude, with a degree of amplitude change from some base value representing the amplitude value.

The present invention may be a system, a method, and/or a computer program product at any possible technical detail level of integration. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

As employed herein, the term "hardware processor subsystem" or "hardware processor" can refer to a processor, memory, software or combinations thereof that cooperate to perform one or more specific tasks. In useful embodiments, the hardware processor subsystem can include one or more data processing elements (e.g., logic circuits, processing circuits, instruction execution devices, etc.). The one or more data processing elements can be included in a central processing unit, a graphics processing unit, and/or a separate processor- or computing element-based controller (e.g., logic gates, etc.). The hardware processor subsystem can include one or more on-board memories (e.g., caches, dedicated memory arrays, read only memory, etc.). In some embodiments, the hardware processor subsystem can include one or more memories that can be on or off board or that can be dedicated for use by the hardware processor subsystem (e.g., ROM, RAM, basic input/output system (BIOS), etc.).

In some embodiments, the hardware processor subsystem can include and execute one or more software elements. The one or more software elements can include an operating system and/or one or more applications and/or specific code to achieve a specified result.

In other embodiments, the hardware processor subsystem can include dedicated, specialized circuitry that performs one or more electronic processing functions to achieve a specified result. Such circuitry can include one or more application-specific integrated circuits (ASICs), FPGAs, and/or PLAs.

These and other variations of a hardware processor subsystem are also contemplated in accordance with embodiments of the present invention.

Reference in the specification to "one embodiment" or "an embodiment" of the present invention, as well as other variations thereof, means that a particular feature, structure, characteristic, and so forth described in connection with the embodiment is included in at least one embodiment of the present invention. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This may be extended, as readily apparent by one of ordinary skill in this and related arts, for as many items listed.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the blocks may occur out of the order noted in the Figures. For example, two blocks shown in succession may, in fact, be accomplished as one step, executed concurrently, substantially concurrently, in a partially or wholly temporally overlapping manner, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

Figure 6:
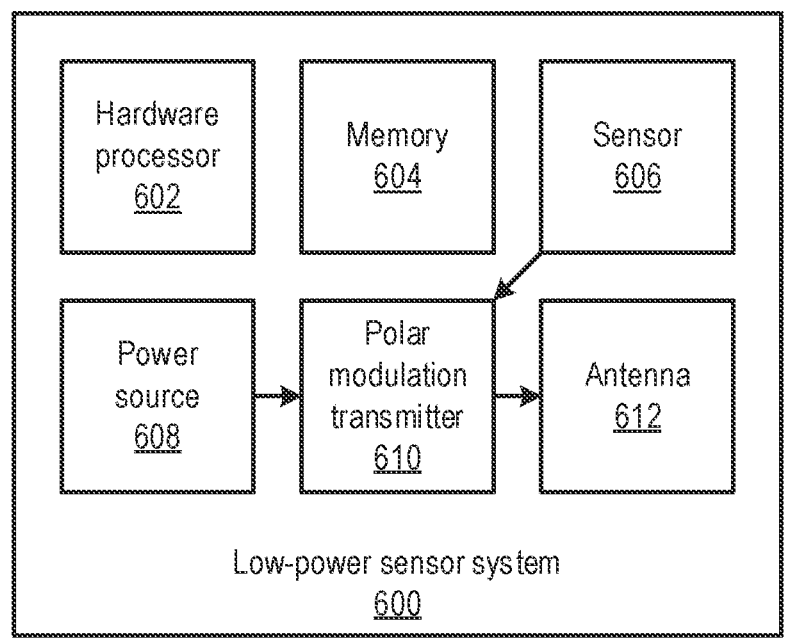
FIG. 6 is a block diagram of a low-power sensor system that generates polar-modulated transmissions, including amplitude modulation by controlling an output of an amplifier, in accordance with an embodiment of the present invention.

Referring now to FIG. 6, an exemplary low-power sensor system 600 is shown. The system 600 includes a hardware processor and a memory 604. Sensor 606 may include one or more sensor components, each providing a measurement of one or more phenomena. Sensor 606 may be on-board, as shown, or may communicate with the system 600 by any appropriate communications interface and protocol.

A power source 608 provides electrical power to a polar modulation transmitter 610. The power source 608 may be any appropriate source, such as a battery, a solar cell, a vibrational power generator, a piezoelectric power generator, any appropriate on-board or off-board power generator, or an external power source. It is specifically contemplated that the power source 608 may have a relatively small size, making it possible to implement the system 600 in a cost-effective and space-efficient manner.

The transmitter 610 uses a power-efficient amplifier 216 to modulate the amplitude of an output signal, for example by controlling the voltage to the amplifier 216. The phase of the output signal is controlled by adjusting the phase of the signal input to the amplifier 216, which may be maintained at a constant amplitude. The modulated signal may include measurements from sensor 606.

The transmitter 610 provides the modulated signal to antenna 612. Antenna 612 may use any appropriate antenna configuration, such as a single antenna or a phased antenna array. In some cases, antenna 612 may include an antenna configuration for a single band, in which case the transmitter 610 may include a matching network 406 to bring antenna 612 into resonance at the transmission frequency.

In some cases, antenna 612 may include a phased array that has multiple antenna elements. In such cases, each of the antenna elements may transmit the same signal, but phase-shifted by differing amounts. The transmitted signals interfere with one another, in some places constructively and in some places destructively, providing a potentially very focused transmission pattern. The transmitter 610 may therefore include a phase shifter on each transmission path leading to the respective antenna elements of antenna 612, and the phase values of these phase shifters may be adjusted in accordance with particular beam patterns.

Having described preferred embodiments of a high-efficiency transmitter (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

What is claimed is:

1. A transmitter, comprising:
a driver to output a polar-modulated signal according to a phase-modulation signal and an amplitude-modulation signal; and
a voltage regulator connected to the driver, having a bandwidth lower than a bandwidth of the amplitude-modulation signal, with the amplitude-modulation signal controlling an input of the voltage regulator and with the amplitude-modulation signal further being combined with an output of the voltage regulator to control an amplitude of the output of the driver to compensate for bandwidth cutoff noise in the voltage regulator.

2. The transmitter of claim 1, wherein the voltage regulator is a low dropout regulator.

3. The transmitter of claim 1, wherein further comprising a phase shifter that synchronizes the phase-modulation signal and the amplitude-modulation signal.

4. The transmitter of claim 1, wherein the phase-modulation signal has a constant amplitude.

5. The transmitter of claim 1, further comprising a replica circuit that has a same circuit structure as the driver, but with a lower current consumption, which is connected to the voltage regulator and which takes the amplitude-modulation signal as input.

6. The transmitter of claim 5, wherein the replica circuit is connected to the amplitude modulation signal in parallel with an input of the voltage regulator.

7. The transmitter of claim 1, wherein the amplitude modulation signal includes a coarse amplitude adjustment part and a fine amplitude adjustment part.

8. A phased-array transmitter, comprising:
a plurality of radio front-ends that each transmit a respective phase-shifted version of a polar-modulated signal, each comprising:
a driver to output a polar-modulated signal according to a phase-modulation signal and an amplitude-modulation signal; and
a voltage regulator connected to the driver, having a bandwidth lower than a bandwidth of the amplitude-modulation signal, with the amplitude-modulation signal controlling an input of the voltage regulator and with the amplitude-modulation signal further being combined with an output of the voltage regulator to control an amplitude of the output of the driver to compensate for bandwidth cutoff noise in the voltage regulator; and
a phased antenna array that transmits the phase-shifted polar-modulated signals.

9. The phased-array transmitter of claim 8, wherein the voltage regulator is a low dropout regulator.

10. The phased-array transmitter of claim 8, wherein each of the radio front-ends further comprises a phase shifter that synchronizes the phase-modulation signal and the amplitude-modulation signal.

11. The phased-array transmitter of claim 8, wherein the phase-modulation signal has a constant amplitude.

12. The phased-array transmitter of claim 8, wherein each of the radio front-ends further comprises a replica circuit that has a same circuit structure as the driver, but with a lower current consumption, which is connected to the voltage regulator and which takes the amplitude-modulation signal as input.

13. The phased-array transmitter of claim 12, wherein the replica circuit is connected to the amplitude modulation signal in parallel with an input of the voltage regulator.

14. The phased-array transmitter of claim 8, wherein the amplitude modulation signal includes a coarse amplitude adjustment part and a fine amplitude adjustment part.

15. A method of transmitting a polar-modulated signal, comprising:
applying a constant-amplitude phase modulation signal to a driver;
applying an amplification-control voltage to the driver using a voltage regulator, having a bandwidth lower than a bandwidth of an amplitude-control voltage, with a first copy of the amplitude modulation signal being applied to an input of the voltage regulator and with a second copy of the amplitude modulation signal being combined with an output of the voltage regulator, to compensate for bandwidth cutoff noise in the voltage regulator; and
transmitting a polar-modulated output of the driver using an antenna.

16. The method of claim 15, wherein the voltage regulator is a low dropout regulator.

17. The method of claim 15, wherein the amplitude modulation signal includes a coarse amplitude adjustment part and a fine amplitude adjustment part.

* * * * *